United States Patent
Aegerter et al.

(10) Patent No.: US 7,429,537 B2
(45) Date of Patent: Sep. 30, 2008

(54) METHODS AND APPARATUS FOR RINSING AND DRYING

(75) Inventors: Brian K. Aegerter, Kalispell, MT (US); Curt T. Dundas, Kalispell, MT (US); Tom L. Ritzdorf, Big Fork, MT (US); Gary L. Curtis, Kila, MT (US); Michael Jolley, Beaverton, OR (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 11/292,823

(22) Filed: Dec. 2, 2005

(65) Prior Publication Data
US 2006/0070638 A1    Apr. 6, 2006

Related U.S. Application Data

(60) Continuation of application No. 10/632,495, filed on Jul. 31, 2003, which is a division of application No. 09/672,572, filed on Sep. 28, 2000, now Pat. No. 6,632,292, which is a continuation-in-part of application No. 09/437,926, filed on Nov. 10, 1999, now Pat. No. 6,413,436, which is a continuation of application No. PCT/US99/05674, filed on Mar. 15, 1999.

(60) Provisional application No. 60/117,474, filed on Jan. 27, 1999, provisional application No. 60/116,750, filed on Jan. 21, 1999.

(51) Int. Cl.
*H01L 21/302*   (2006.01)

(52) U.S. Cl. .................. 438/745; 438/750; 134/1.2; 154/345.11

(58) Field of Classification Search ............... 438/692, 438/693, 745, 750; 134/1.1, 1.2, 1.3; 156/345.11
See application file for complete search history.

(56) References Cited

U.S. PATENT DOCUMENTS

| 4,788,994 | A | * | 12/1988 | Shinbara ............... 134/157 |
| 4,871,417 | A | | 10/1989 | Nishizawa et al. |
| 5,271,774 | A | | 12/1993 | Leenaars et al. |
| 5,660,642 | A | | 8/1997 | Britten |
| 6,077,412 | A | * | 6/2000 | Ting et al. ............... 205/143 |
| 6,247,479 | B1 | * | 6/2001 | Taniyama et al. ......... 134/95.2 |
| 6,491,764 | B2 | | 12/2002 | Mertens et al. |
| 6,754,980 | B2 | | 6/2004 | Lauerhaas et al. |

FOREIGN PATENT DOCUMENTS

| JP | 409038595 | * | 2/1997 |
| JP | 10335298 | * | 12/1998 |

* cited by examiner

*Primary Examiner*—Lan Vinh
(74) *Attorney, Agent, or Firm*—Kenneth H. Ohriner; Perkins Coie LLP

(57) ABSTRACT

A method for rinsing and drying a workpiece includes placing the workpiece into a chamber and spinning the workpiece. A rinsing fluid, such as water, is applied onto the workpiece through a first outlet in the chamber, with the rinsing fluid moving outwardly towards the edge of the workpiece via centrifugal force, to rinse the workpiece. A drying fluid, such as an alcohol vapor, is applied onto the workpiece through the first outlet, with the drying fluid moving outwardly towards the edge of the workpiece via centrifugal force, to dry the workpiece. The drying fluid advantageously follows a meniscus of the rinsing fluid across the workpiece surface. The rinsing fluid, or the drying fluid, or both fluids, may be applied near or at a central area of the workpiece.

15 Claims, 11 Drawing Sheets

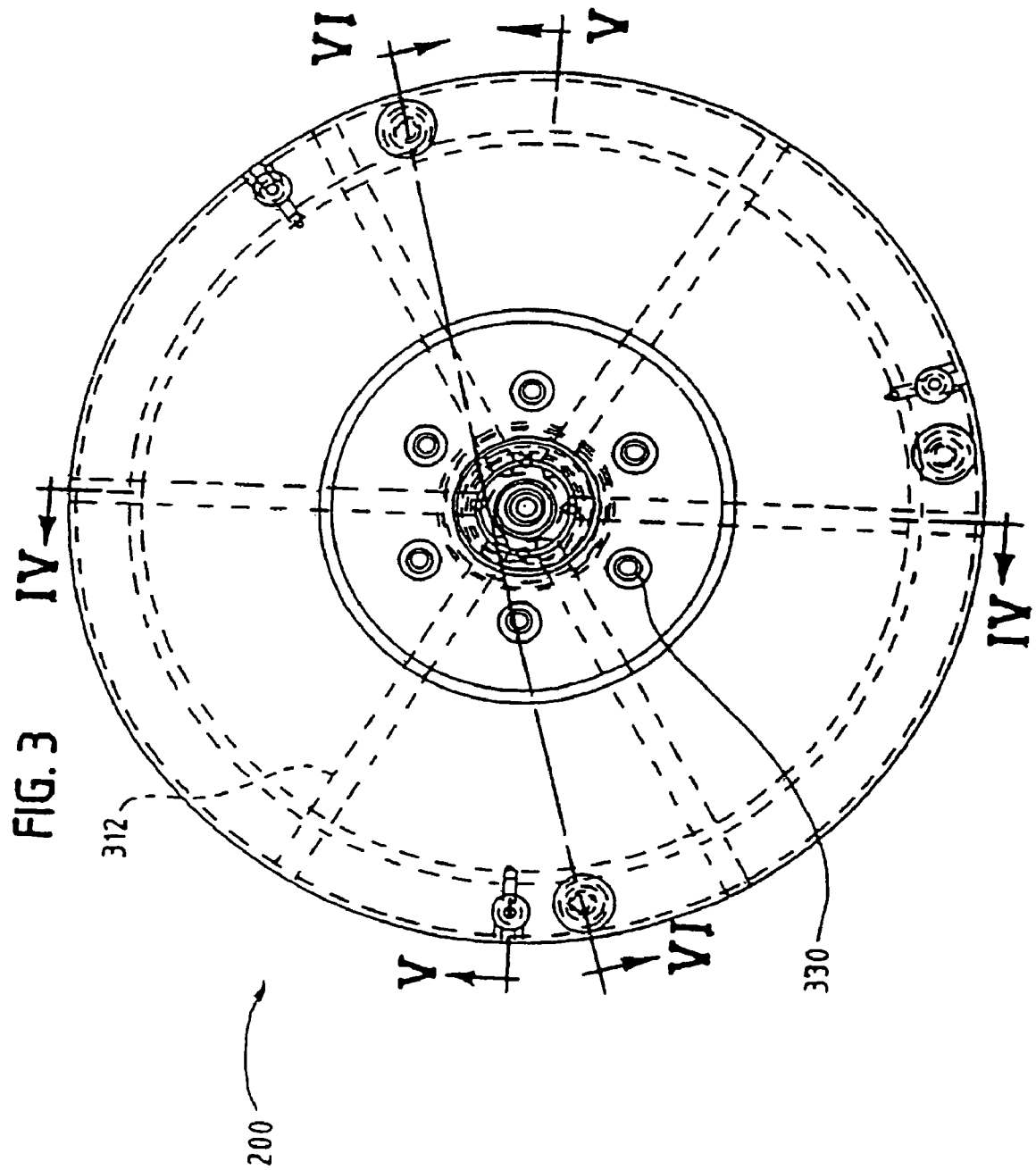

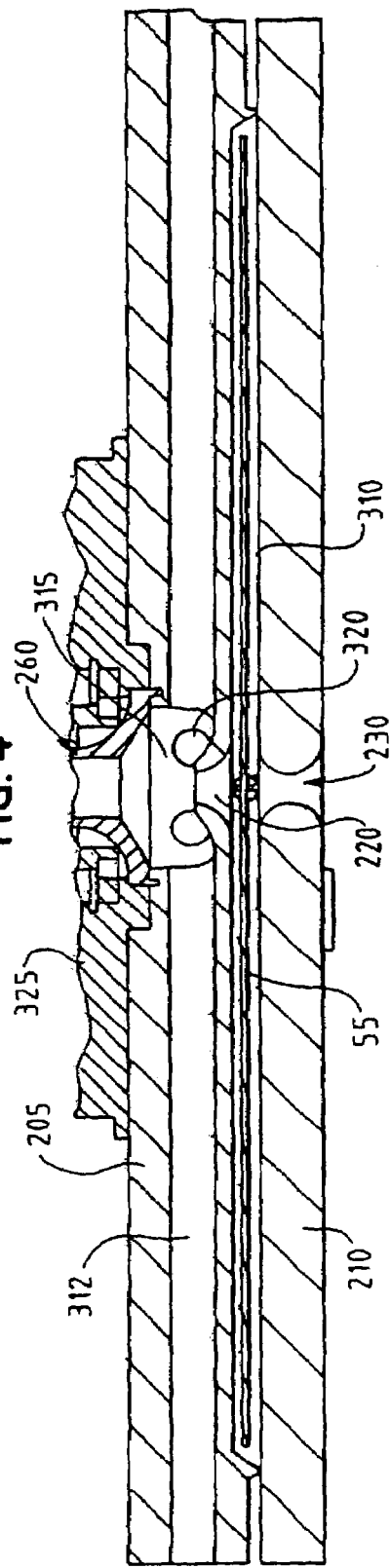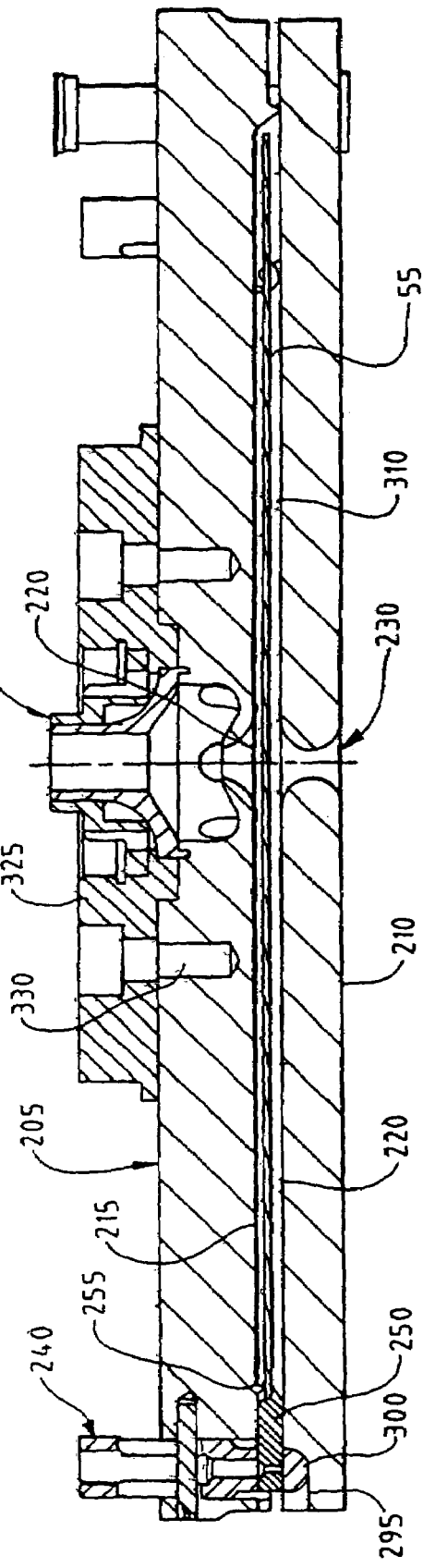

METHODS AND APPARATUS FOR RINSING AND DRYING

This Application is a: Continuation of U.S. patent application Ser. No. 10/632,495 filed Jul. 31, 2003 and now pending, which is a Division of U.S. patent application Ser. No. 09/672,572 filed Sep. 28, 2000, now U.S. Pat. No. 6,632,292B1, which is a Continuation-in-Part of U.S. patent application Ser. No. 09/437,926 filed Nov. 10, 1999, now U.S. Pat. No. 6,413,436, which is a Continuation of International Application No. PCT/US99/05674, filed Mar. 15, 1999, designating the U.S. and published in English, which claims priority to U.S. patent application Ser. Nos.:

Ser No. 09/041,649 filed Mar. 13, 1998, now U.S. Pat. No. 6,318,385;

Ser. No. 09/113,435 filed Jul. 10, 1998, now U.S. Pat. No. 6,264,752;

Ser. No. 09/041,901 filed Mar. 13, 1998, now U.S. Pat. No. 6,350,319;

U.S. Provisional Application 60/116,750 filed Jan. 22, 1999;

and U.S. Provisional Application 60/117,474 filed Jan. 27, 1999.

The above-listed Applications and U.S. Pat. No. 6,423,642 are incorporated herein by reference.

BACKGROUND

One of the most important processes in the fabrication of integrated circuits involves the rinsing and drying of the semiconductor wafers between various chemical processing steps. During rinsing, de-ionized (DI) water is often used to assist in the removal of chemicals from the surface of the wafer. After rinsing is completed, the wafer surface must be dried. It is during the drying step that wafer contamination often results. Such contamination is due to the fact that the evaporation of the DI water deposits contaminant particles on the wafer surface.

Various techniques have been proposed for the rinsing and drying of semiconductor wafers. One technique used to both rinse and dry wafers relies upon a spin rinser/dryer. Such a system uses a DI rinse water spray to rinse the wafer. The wafer is spun during the drying step thereby removing the water from the surface of the semiconductor wafer through evaporation and the action of centrifugal acceleration.

Other techniques used to dry wafers include the use of isopropyl alcohol (IPA) vapor dryers, full displacement IPA dryers, and other forms of IPA dryers. These IPA dryers rely upon a large quantity of a solvent, such as IPA and other volatile organic liquids, to facilitate drying of the semiconductor wafer. One limitation of this type of dryer is its use of large solvent quantities which are highly flammable and often hazardous to health and environment. Further, these dryer types are often quite expensive. Still further, the large quantities of hot solvent are often incompatible with certain recessed pattern wafers and may be detrimental to certain device structures.

A still further drying technique is known as a Marangoni dryer. In a Marangoni dryer, the wafer is slowly withdrawn from the rinsing liquid in an atmosphere having a vapor that is miscible with the rinsing liquid. As the wafer is withdrawn, a meniscus is formed at the wafer surfaces. The surface tension of the rinsing fluid at the meniscus is reduced as a result of the presence of the vapor. The reduced surface tension gives rise to a substantially particle free drying process.

The demands for integrated circuit rinsing/drying processes may ultimately require more control and economic efficiency from the rinser/dryer. As such, a substantially new approach to rinsing and drying of the semiconductor wafer has been undertaken which provides greater control of the rinsing and drying fluids. Further, wafers may be rinsed and dried on an individual basis more quickly when compared to the drying of an individual wafer using any of the foregoing processes

BRIEF DESCRIPTION OF THE DRAWINGS

FIG. 3 is a top plan view of the rinser/dryer housing of FIG. 2 when the housing is in an assembled state.

FIG. 4 is a cross-sectional view of the rinser/dryer housing taken along line IV-IV of FIG. 3.

FIG. 5 is a cross-sectional view of the rinser/dryer housing taken along line V-V of FIG. 3.

DETAILED DESCRIPTION OF THE INVENTION

Figure 1:
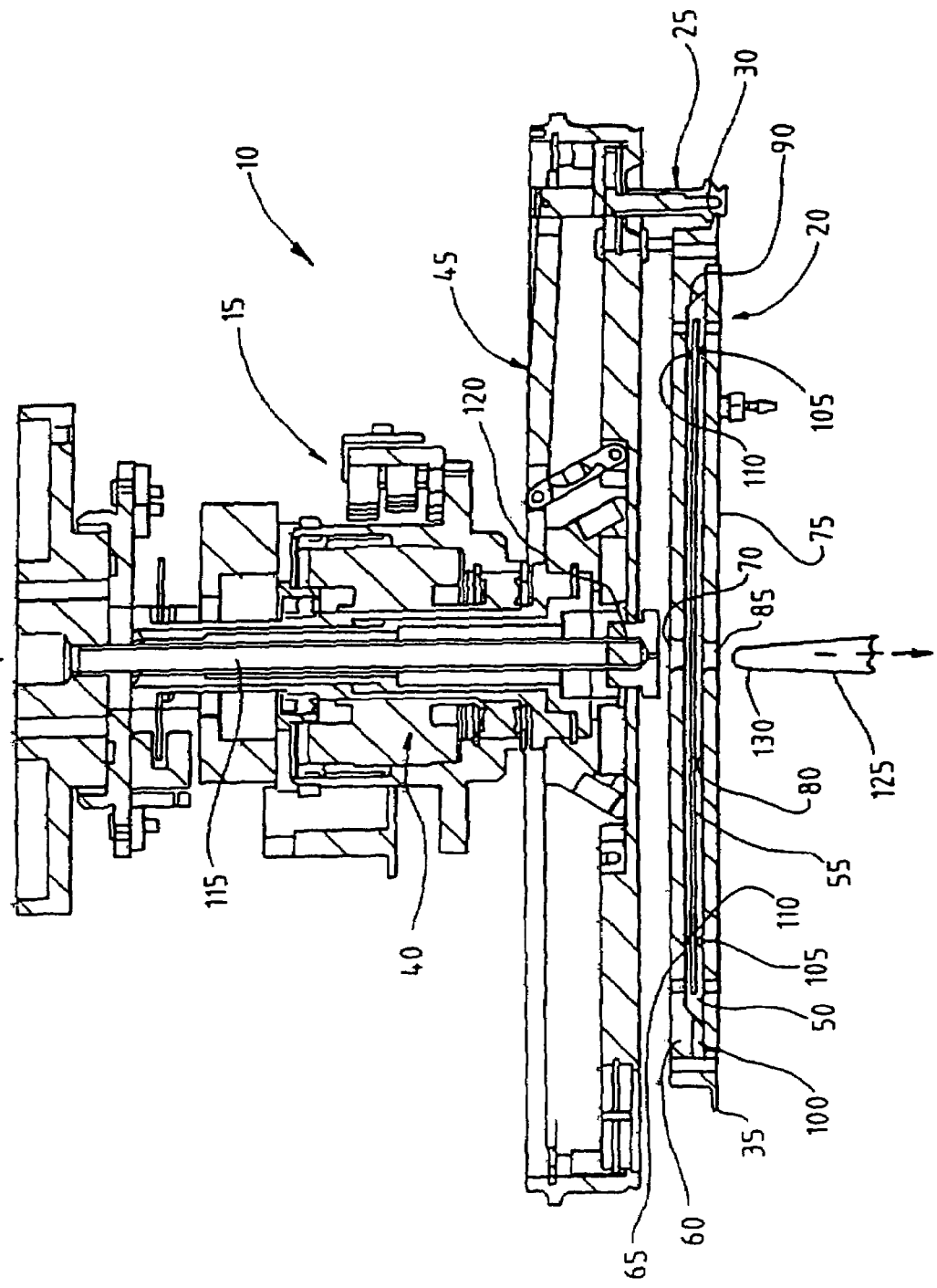
FIG. 1 is a cross-sectional view of a rinser/dryer housing and a rotor assembly constructed in accordance with one embodiment of the invention.

FIG. 1 is a cross-sectional view of one embodiment of a rinser/dryer, shown generally at 10. The embodiment of the rinser/dryer 10 of FIG. 1 is generally comprised of a rotor 15 and a rinser/dryer housing 20. The rotor 15 includes support members 25 that extend downwardly to engage the rinser/dryer housing 20. Each of the support members 25 includes a groove 30 dimensioned to engage a radially extending flange 35 that extends about a peripheral region of the rinser/dryer housing 20. A motor assembly 40 rotates a hub 45, including the support members 25, about a central axis 47. Rinser/dryer housing 20 is thus secured for rotation with the hub 45 when support members 25 are engaged with flange 35. Other constructions of the rotor 15 and the engagement mechanism used for securement with the rinser/dryer housing 20 may also be used.

The rinser/dryer housing 20 of the embodiment of FIG. 1 defines a substantially closed rinser/dryer chamber 50. Preferably, the substantially closed rinser/dryer chamber 50 is formed in the general shape of the workpiece 55 and closely conforms with the surfaces of the workpiece. The specific construction of FIG. 1 includes an upper chamber member 60 having an interior chamber face 65. The upper chamber member 60 includes a centrally disposed fluid inlet opening 70 in the interior chamber face 65. The specific construction also includes a lower chamber member 75 having an interior chamber face 80. The lower chamber member 75 has a centrally disposed fluid inlet opening 85 in the interior chamber face 80. The upper chamber member 60 and the lower chamber member 75 engage one another to define the rinser/dryer chamber 50. The upper chamber member 60 includes sidewalls 90 that project downward from the interior chamber face 65. One or more outlets 100 are disposed at the peripheral regions of the rinser/dryer chamber 50 through the sidewalls 90 to allow fluid within the chamber 50 to exit therefrom through centrifugal acceleration that is generated when the housing 20 is rotated about axis 47.

In the illustrated embodiment, the workpiece 55 is a generally circular wafer having upper and lower planar surfaces. As such, the rinser/dryer chamber 50 is generally circular in plan view and the interior chamber faces 65 and 80 are generally planar and parallel to the upper and lower planar surfaces of the workpiece 55. The spacing between the interior chamber faces 65 and 80 and the upper and lower planar surfaces of the workpiece 55 is generally quite small. Such spacing is preferably minimized to provide substantial control of the physical properties of a rinsing/drying fluid flowing through the interstitial regions.

The wafer 55 is spaced from the interior chamber face 80 by a plurality of spacing members 105 extending from the interior chamber face 80. Preferably, a further set of spacing members 110 extend from the interior chamber face 65 and are aligned with the spacing members 105 to grip the wafer 55.

Fluid inlet openings 70 and 85 provide communication passageways through which one or more rinsing/drying fluids may enter the chamber 50 for processing the wafer surfaces. In the illustrated embodiment, rinsing/drying fluids are delivered from above the wafer 55 to inlet 70 through a fluid supply tube 115 having a fluid outlet nozzle 120 disposed proximate inlet 70. Fluid supply tube 115 extends centrally through the rotor 15 and is preferably concentric with the axis rotation 47. Similarly, rinsing/drying fluids are delivered from below the wafer 55 to inlet 85 through a fluid supply tube 125. Fluid supply tube 125 terminates at a nozzle 130 near inlet 85. Although nozzles 120 and 130 terminate at a position that is spaced from their respective inlets, tubes 115 and 125 may be extended so that gaps 135 are not present. Rather, nozzles 120 and 130 or tubes 115 and 125 may include rotating seal members that abut and seal with the respective upper and lower chamber members 60 and 75 in the regions of the inlets 70 and 85.

During processing, one or more rinsing/drying fluids are individually or concurrently supplied through fluid supply tubes 115 and 125 and inlets 70 and 85 for contact with the surfaces of the workpiece 55 in the chamber 50. Preferably, the housing 20 is rotated about axis 47 by the rotor 15 during processing to generate a continuous flow of any fluid within the chamber 50 across the surfaces of the workpiece 55 through centrifugal force. Rinsing/drying fluid entering the inlet openings 70 and 85 are thus driven across the workpiece surfaces in a direction radially outward from the center of the workpiece 55 to the edge of the workpiece 55. At the edge of the workpiece 55, any spent rinsing/drying fluid is directed to exit the chamber 50 through outlets 100. Spent rinsing/drying fluids may be accumulated in a cup reservoir disposed below and/or about the rinser/dryer housing 20.

Figure 2:
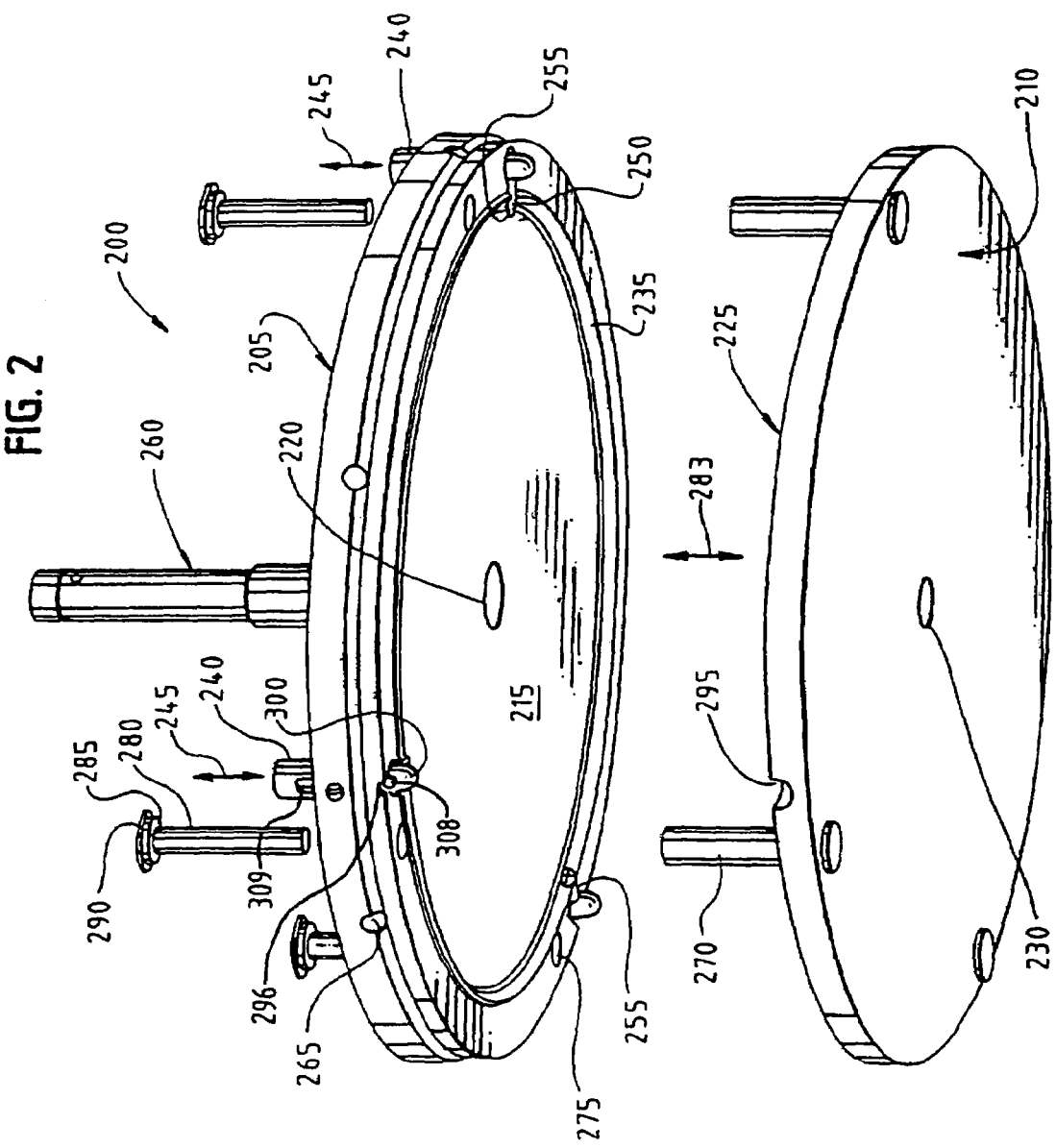
FIG. 2 is an exploded view of a further embodiment of a rinser/dryer housing.

FIG. 2 is a perspective view of a further rinser/dryer construction wherein the rinser/dryer is disposed at a fixed processing station and can open and close to facilitate insertion and extraction of the workpiece. The rinser/dryer, shown generally at 200, has upper and lower chamber members, 205 and 210, respectively. As in the prior embodiment, the upper chamber member 205 includes a generally planar chamber face 215 having a centrally disposed inlet 220. Although not shown in the view of FIG. 2, the lower chamber member 210 likewise has a generally planar interior chamber face 225 having a central inlet 230. The upper chamber member 205 includes a downwardly extending sidewall 235 that, for example, may be formed from a sealing polymer material or may be formed integrally with other portions of member 205.

The upper and lower chamber members, 205 and 210, are separable from one another to accept a workpiece. With a workpiece disposed between them, the upper and lower chamber members, 205 and 210, move toward one another to form a chamber in which the workpiece is supported in a position in which it is spaced from the planar interior chamber faces 215 and 225. In the embodiment of the rinser/dryer disclosed in FIGS. 2-8B, the workpiece, such as a semiconductor wafer, is clamped in place in the chamber formed by the upper and lower chamber members, 205 and 210, between a plurality of support members 240 and corresponding spacing members 255 when the upper and lower chamber members are joined to form the chamber (see FIG. 7B). Axial movement of the upper and lower chamber members toward and away from each other is facilitated by a plurality of fasteners 307. Preferably, the fasteners 307 bias the upper and lower chambers to a closed position as illustrated at FIG. 7A.

In the disclosed embodiment, the wafer support members 240 extend about a peripheral region of the upper chamber member 205 at positions that are radially exterior of the sidewall 235. The wafer support members 240 are preferably disposed for linear movement along respective axes 245 to allow the support members 240 to clamp the wafer against the spacing members 255 when the upper and lower chamber members are disposed in a closed position (see FIG. 7A), and to allow the support members 240 to release the wafer from such clamping action when the upper and lower chamber members are separated (see FIG. 8A). Each support member 240 includes a support arm 250 that extends radially toward the center of the upper chamber member 205. An end portion of each arm 250 overlies a corresponding spacing member 255 that extends from the interior chamber face 215. Preferably, the spacing members 255 are each in the form of a cone having a vertex terminating proximate the end of the support arm 250. Notches 295 are disposed at peripheral portions of the lower chamber member 210 and engage rounded lower portions 300 of the wafer support members 240. When the lower chamber member 210 is urged upward to the closed position, notches 295 engage end portions 300 of the support members 240 and drive them upward to secure the wafer 55 between the arms 250 of the supports 240 and the corresponding spacing members 255. This closed state is illustrated in FIG. 5. In the closed position, the notches 295 and corresponding notches 296 of the upper chamber member (see FIG. 2) provide a plurality of outlets at the peripheral regions of the rinser/dryer 200. Radial alignment of the arm 250 of each support member 240 is maintained by a set pin 308 that extends through lateral grooves 309 disposed through an upper portion of each support member.

Figure 6:
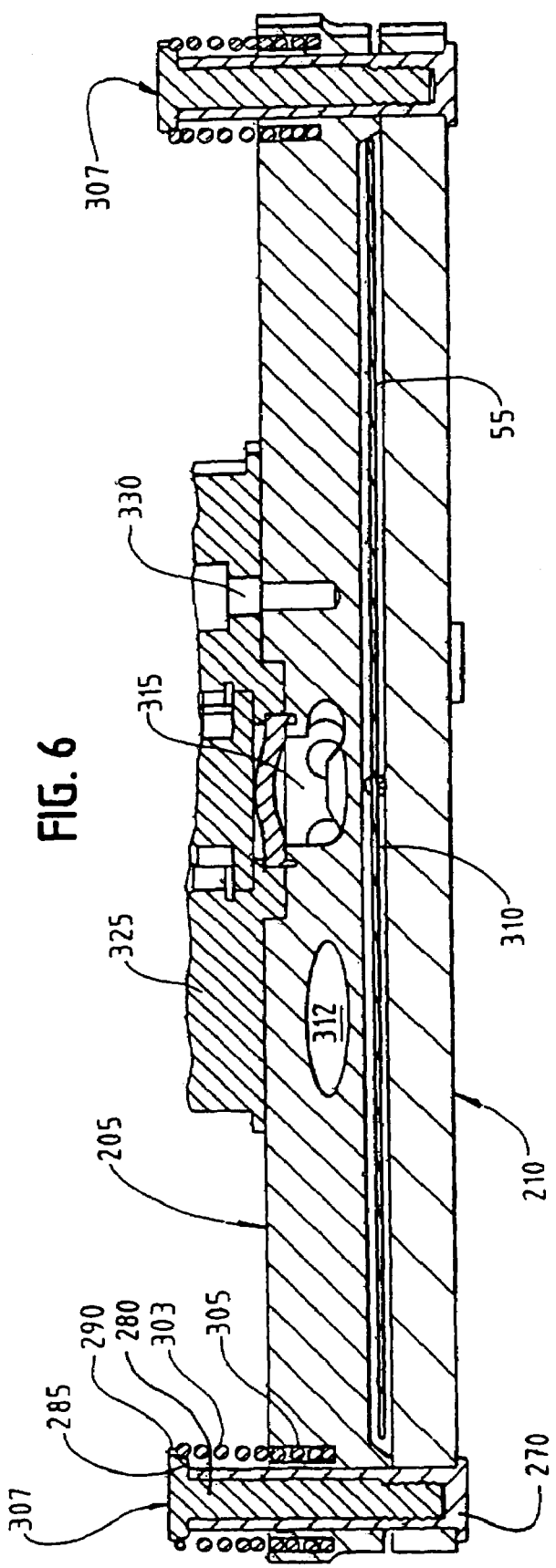
FIG. 6 is a cross-sectional view of the rinser/dryer housing taken along line VI-VI of FIG. 3.
Figure 7A:
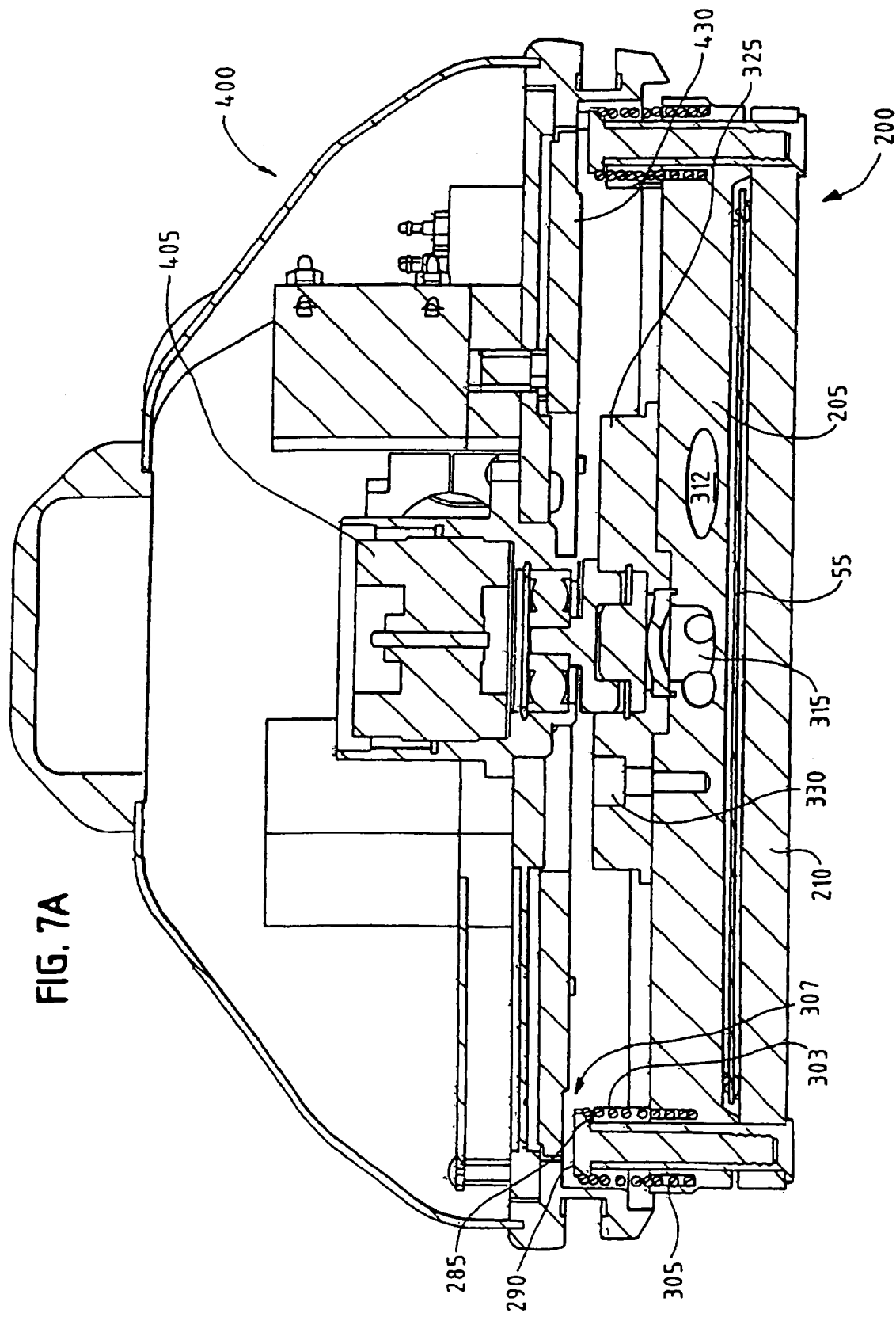
FIGS. 7A and 7B are cross-sectional views showing the rinser/dryer housing in a closed state and connected to a rotary drive assembly.
Figure 7B:
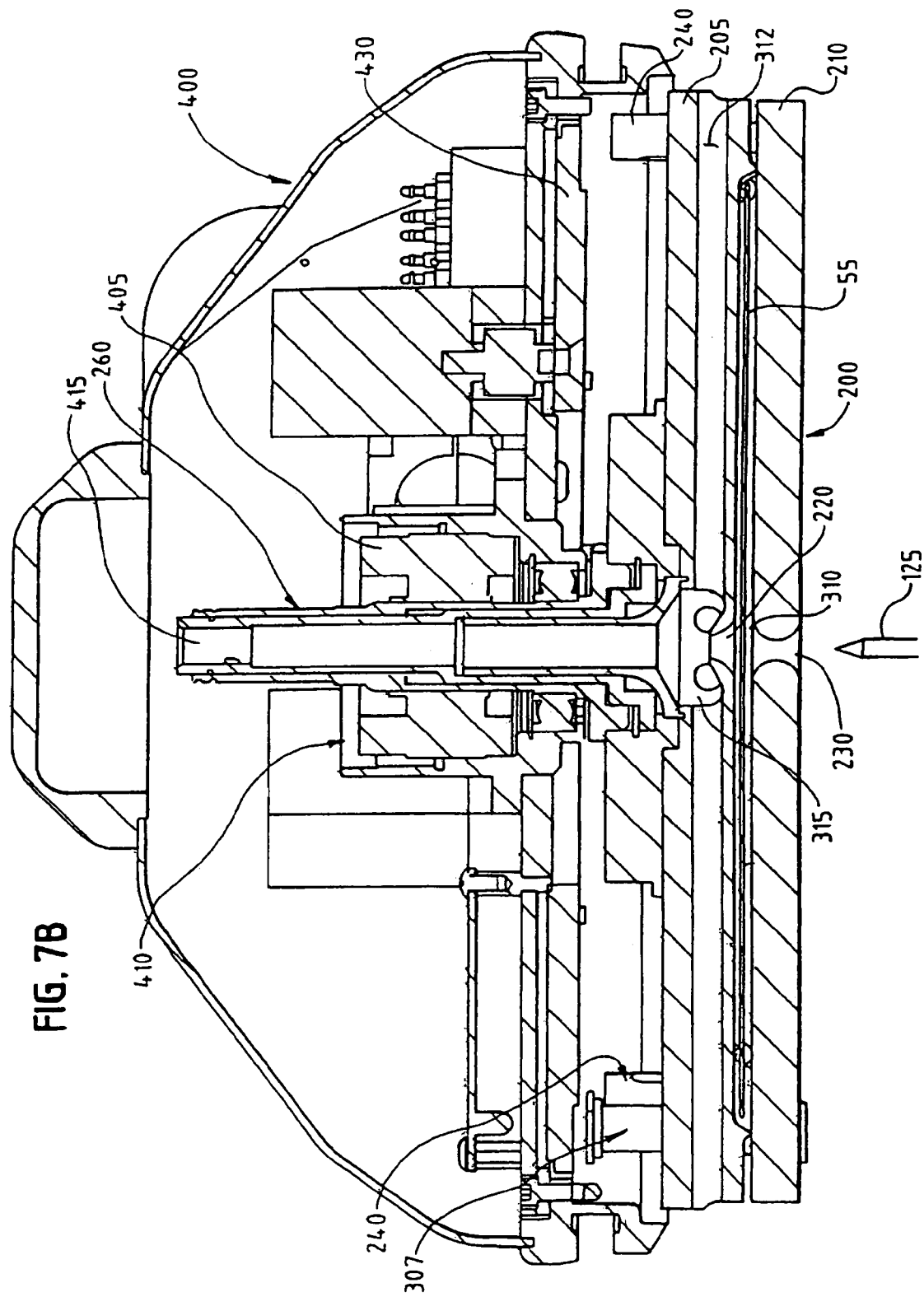

The construction of the fasteners 307 that allow the upper and lower chamber members to be moved toward and away from one another is illustrated with respect to FIGS. 2, 6 and 7B. As shown, the lower chamber member 210 includes a plurality of hollow cylinders 270 that are fixed thereto and extend upward through corresponding apertures 275 at the peripheral region of the upper chamber member 205 to form lower portions of each fastener 307. Rods 280 extend into the hollow of the cylinders 270 and are secured therein to form an upper portion of each fastener 307. Together, the rods 280 and cylinders 270 form the fasteners 307 that allow relative linear movement between the upper and lower chamber members, 205 and 210, along axis 283 between the open and closed position. Two flanges, 285 and 290, are disposed at an upper portion of each rod 280. Flange 285 functions as a stop member that limits the extent of separation between the upper and lower chamber members, 205 and 210, in the open position. Flanges 290 provide a surface against which a biasing member, such as a spring (see FIG. 6) or the like, acts to bias the upper and lower chamber members, 205 and 210, to the closed position.

With reference to FIG. 6, the spring 303 or the like, has a first end that is positioned within a circular groove 305 that extends about each respective fastener 307. A second end of each spring is disposed to engage flange 290 of the respective fastener 307 in a compressed state thereby causing the spring to generate a force that drives the fastener 307 and the lower chamber member 210 upward into engagement with the upper chamber member 205.

The rinser/dryer 200 is designed to be rotated about a central axis during processing of the workpiece. To this end, a centrally disposed shaft 260 extends from an upper portion of the upper chamber member 205. As will be illustrated in further detail below in FIGS. 7A-8B, the shaft 260 is connected to engage a rotary drive motor for rotational drive of the rinser/dryer 200. The shaft 260 is constructed to have a centrally disposed fluid passageway (see FIG. 4) through which a processing fluid may be provided to inlet 220. Alternatively, the central passageway may function as a conduit for a separate fluid inlet tube or the like.

As illustrated in FIGS. 3 and 4, a plurality of optional overflow passageways 312 extend radially from a central portion of the upper chamber member 205. Shaft 260 terminates in a flared end portion 315 having inlet notches 320 that provide fluid communication between the upper portion of processing chamber 310 and the overflow passageways 312. The flared end 315 of the shaft 260 is secured with the upper chamber member 205 with, for example, a mounting plate 325. Mounting plate 325, in turn, is secured to the upper chamber member 205 with a plurality of fasteners 330 (FIG. 5). Overflow passages 312 allow processing fluid to exit the chamber 310 when the flow of fluid to the chamber 310 exceeds the fluid flow from the peripheral outlets of the chamber.

Figure 8A:
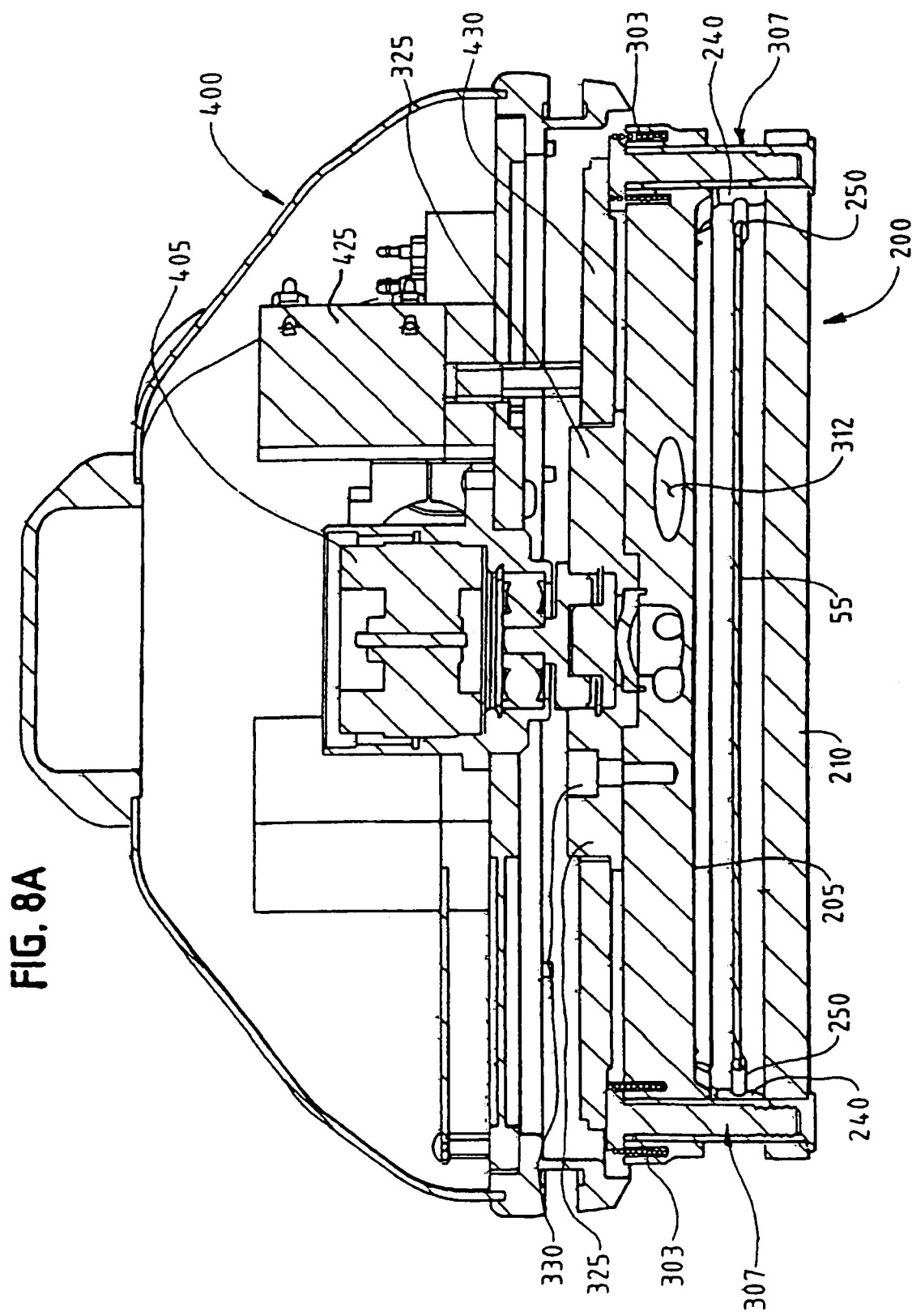
FIGS. 8A and 8B are cross-sectional views showing the rinser/dryer housing in an open state and connected to a rotary drive assembly.
Figure 8B:
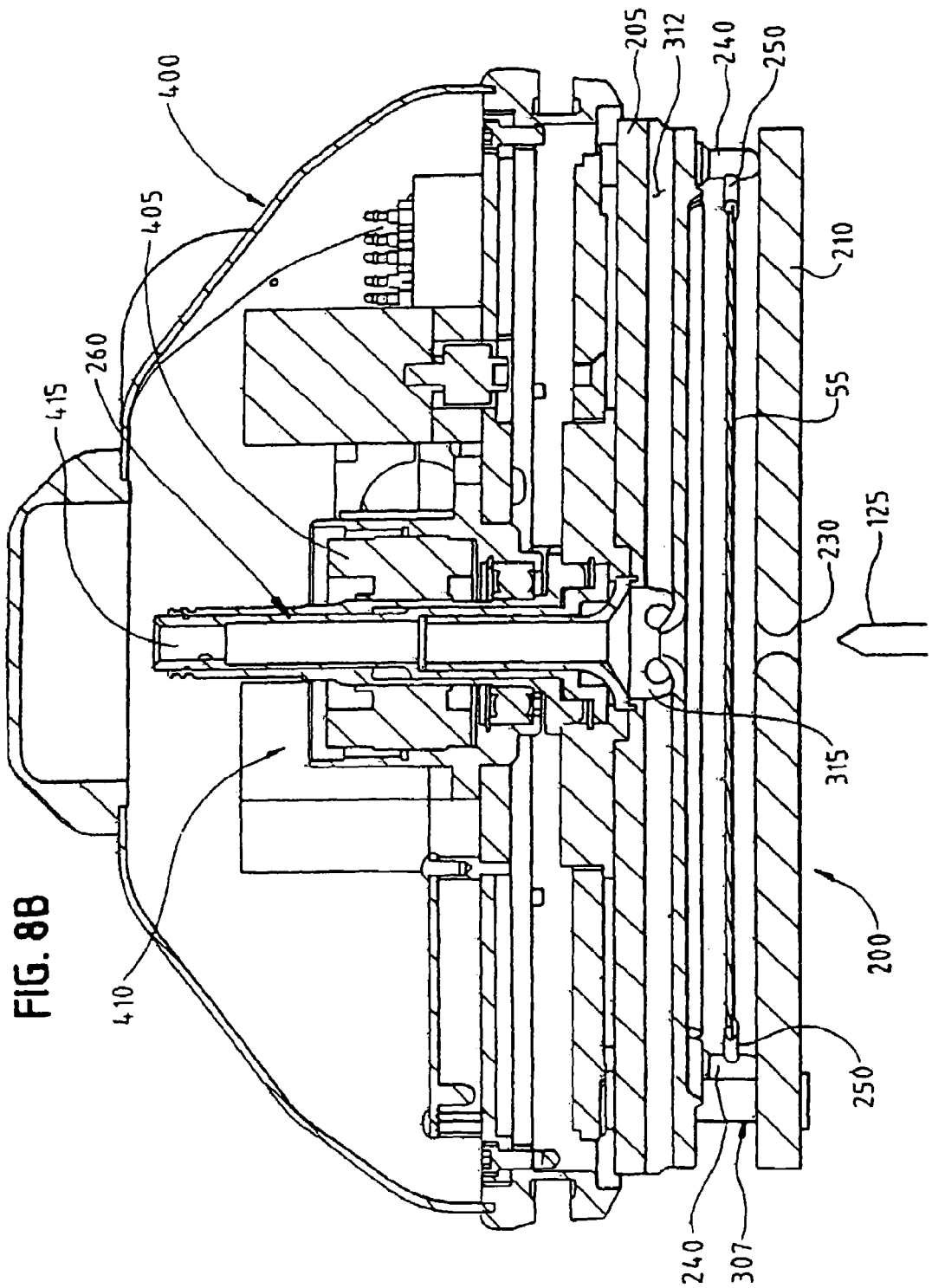

FIGS. 7A and 7B are cross-sectional views showing the rinser/dryer 200 in a closed state and connected to a rotary drive assembly, shown generally at 400, while FIGS. 8A and 8B are similar cross-sectional views showing the rinser/dryer 200 in an opened state. As shown, shaft 260 extends upward into the rotary drive assembly 400. Shaft 260 is provided with the components necessary to cooperate with a stator 405 to form a rotary drive motor assembly 410.

As in the embodiment of FIG. 1, the upper and lower chamber members 205 and 210 join to define the substantially closed rinser/dryer chamber 310 that, in the preferred embodiment, substantially conforms to the shape of the workpiece 55. Preferably, the wafer 55 is supported within the chamber 310 in a position in which its upper and lower faces are spaced from the interior chamber faces 215 and 225. As described above, such support is facilitated by the support members 240 and the spacing members 255 that clamp the peripheral edges of the wafer 55 when the rinser/dryer 200 is in the closed position of FIGS. 7A and 7B.

It is in the closed state of FIGS. 7A and 7B that processing of the wafer 55 takes place. With the wafer secured within the rinser/dryer chamber 310, processing fluid is provided through passageway 415 of shaft 260 and inlet 220 into the interior of chamber 310. Similarly, processing fluid is also provided to the chamber 310 through a processing supply tube 125 that directs fluid flow through inlet 230. As the rinser/dryer 200 is rotated by the rotary drive motor assembly 410, any fluid supplied through inlets 220 and 230 is driven across the surfaces of the wafer 55 by forces generated through centrifugal acceleration. Spent processing fluid exits the processing chamber 310 from the outlets at the peripheral regions of the rinser/dryer 200 formed by notches 295 and 296. Such outlets exist since the support members 240 are not constructed to significantly obstruct the resulting fluid flow. Alternatively, or in addition, further outlets may be provided at the peripheral regions.

Once processing has been completed, the rinser/dryer 200 is opened to allow access to the wafer, such as shown in FIGS. 8A and 8B. After processing, actuator 425 is used to drive an actuating ring 430 downward into engagement with upper portions of the fasteners 307. Fasteners 307 are driven against the bias of spring 303 causing the lower chamber member 210 to descend and separate from the upper chamber member 205. As the lower chamber member 210 is lowered, the support members 240 follow it under the influence of gravity or a biasing member while concurrently lowering the wafer 55. In the lower position, the rinser/dryer chamber 310 is opened thereby exposing the wafer 55 for removal and/or allowing a new wafer to be inserted into the rinser/dryer 200. Such insertion and extraction can take place either manually, or by an automatic robot.

Figure 9:
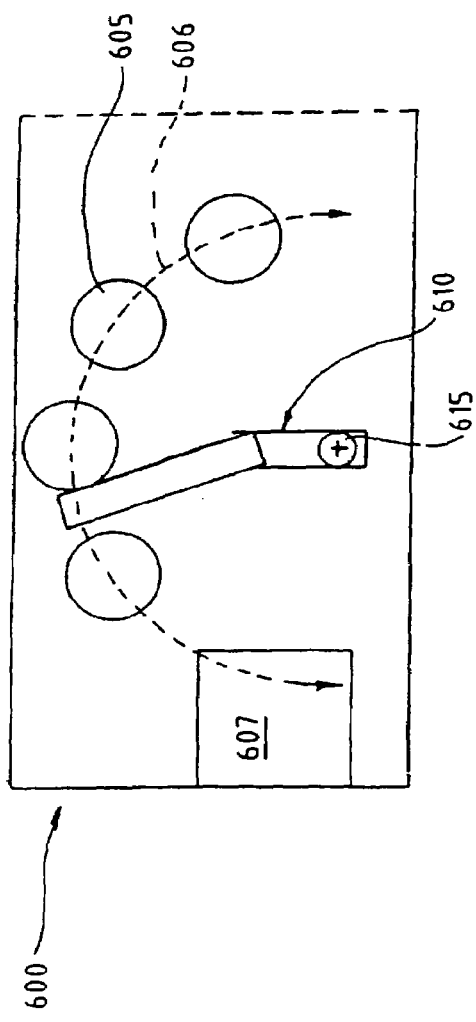
FIGS. 9 and 10 are schematic diagrams of exemplary processing tools including the present rinser/dryer.
Figure 10:
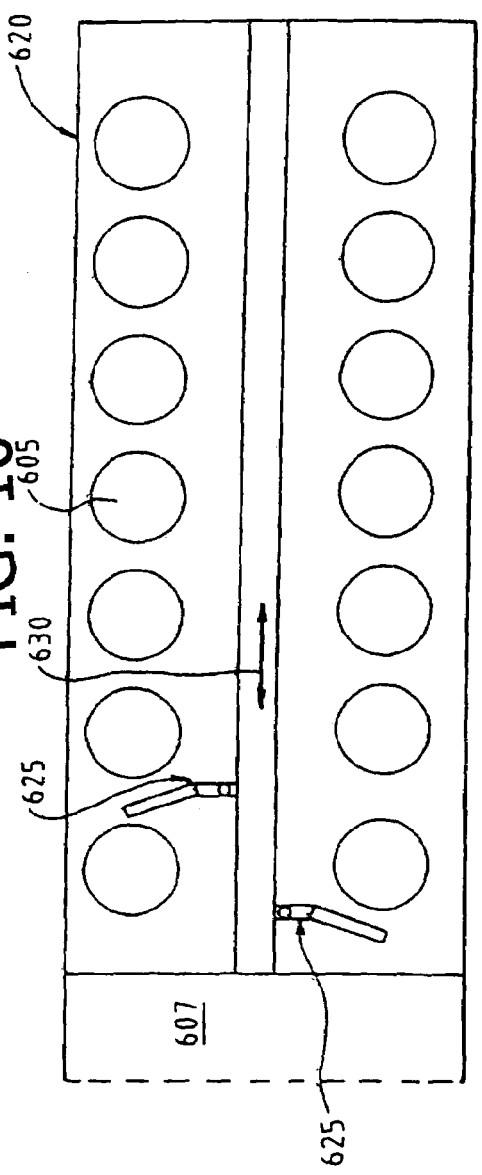

FIGS. 9 and 10 illustrate two different types of processing tools, each of which may employ one or more processing stations including the rinser/dryer constructions described above. FIG. 9 is a schematic block diagram of a tool, shown generally at 600, including a plurality of processing stations 605 disposed about an arcuate path 606. The processing stations 605 may all perform similar processing operations on the wafer, or may perform different but complementary processing operations. For example, one or more of the processing stations 605 may execute an electrodeposition process of a metal, such as copper, on the wafer, while one or more of the other processing stations perform complementary processes such as, for example, clean/dry processing, pre-wetting processes, photoresist processes, etching processes, etc.

Wafers that are to be processed are supplied to the tool 600 at an input/output station 607. The wafers may be supplied to the tool 600 in, for example, S.M.I.F. pods, each having a plurality of the wafers disposed therein. Alternatively, the wafers may be presented to the tool 600 in individual rinser/dryer housings, such as at 20 of FIG. 1.

Each of the processing stations 605 may be accessed by a robotic arm 610. The robotic arm 610 transports the rinser/dryer housings, or individual wafers, to and from the input/output station 607. The robotic arm 610 also transports the wafers or housings between the various processing stations 605.

In the embodiment of FIG. 9, the robotic arm 610 rotates about axis 615 to perform the transport operations along path 606. In contrast, the tool shown generally at 620 of the FIG. 10 utilizes one or more robotic arms 625 that travel along a linear path 630 to perform the required transport operations. As in the embodiment of FIG. 9, a plurality of individual processing stations 605 are used, but more processing stations 605 may be provided in a single processing tool in this arrangement.

Figure 11:
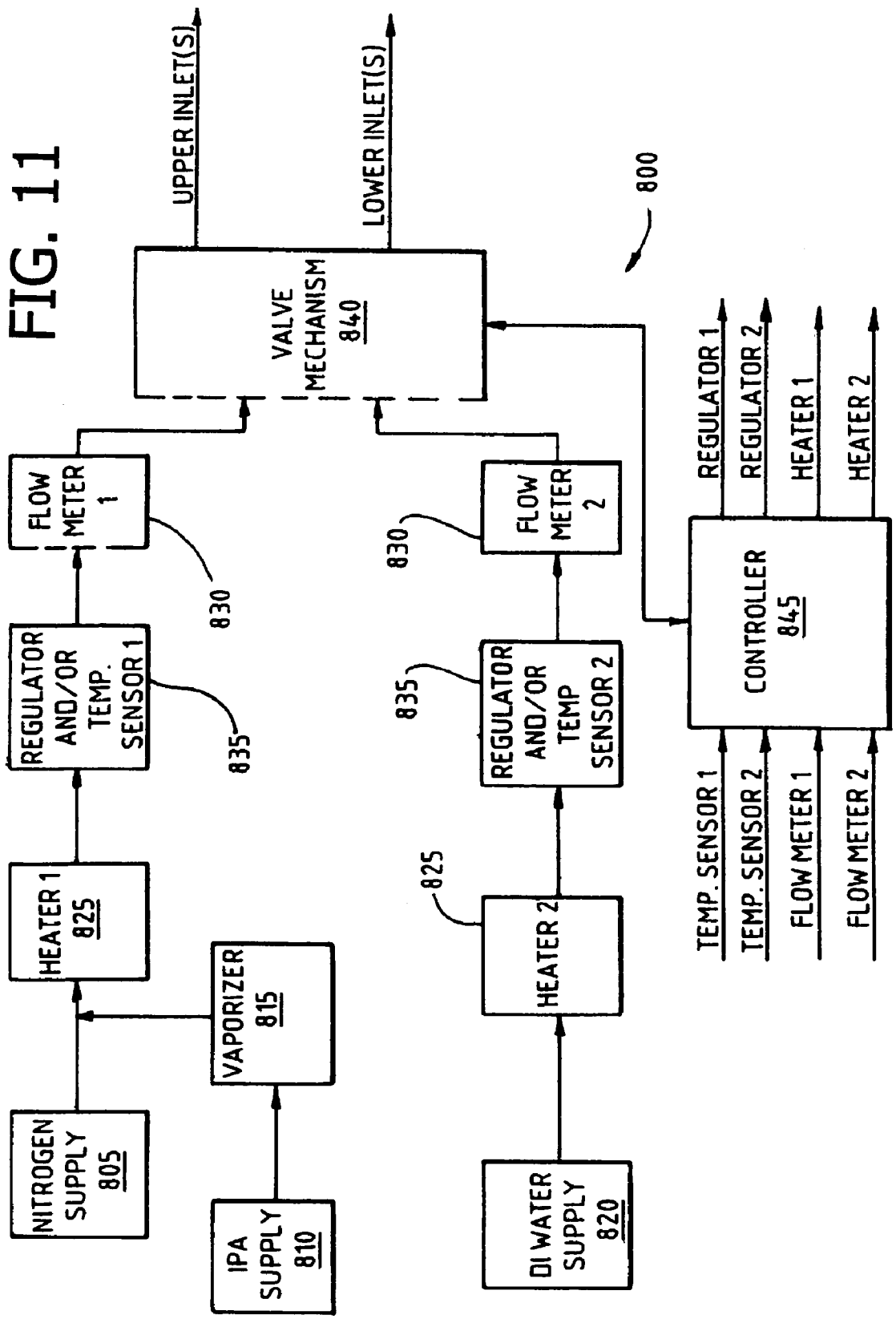
FIG. 11 is a schematic diagram of one embodiment of a fluid supply system that may be used to supply rinsing and drying fluids to the rinser/dryer.

FIG. 11 illustrates one manner of controlling the provision of rinsing/drying fluids that are supplied to the rinser/dryer of any of the foregoing embodiments. As illustrated, the fluid supply system, shown generally at 800, includes a nitrogen gas supply 805, an IPA supply 810, an IPA vaporizer 815, a DI water supply 820, optional heating elements 825, optional flowmeters 830, optional flow regulators/temperature sensors 835, and valve mechanism 840. All of the various components of the system 800 may be under the control of a controller unit 845 having the appropriate software programming.

In operation of the rinser/dryer, the valve mechanism 840 is connected to supply DI water from supply 820 to both the upper and lower inlets of the rinser/dryer chamber. As the water is supplied to the chamber, the wafer is spun at, for example, a rate of 200 RPM. This causes the water to flow across each surface of the wafer under the action of centrifugal acceleration. Once a sufficient amount of water has been supplied to the chamber to rinse the wafer surfaces, valve mechanism 840 is operated to provide a drying fluid, preferably comprised of nitrogen and IPA vapor, to both the upper and lower inlets of the rinser/dryer chamber. Valve mechanism 840 is preferably operated so that the front of the drying fluid immediately follows the trailing end of the DI water. As the drying fluid enters the chamber, centrifugal acceleration resulting from the spinning of the wafer drives the drying fluid across the wafer surface and follows a meniscus across the wafer surface formed by the DI water. The IPA vapor assists in providing a drying of the surface of the wafer at the edge of the meniscus. Drying of the wafer may be further enhanced by heating the DI water and/or the nitrogen/IPA vapor using heating elements 825. The particular temperature at which these fluids are supplied may be controlled by the controller 845. Similarly, flow regulators 835 and flowmeters 830 may be used by controller 845 to regulate the flow of the DI water and/or the nitrogen/IPA vapor to the rinser/dryer chamber.

On an individual wafer basis, the drying time for the individual wafer in the disclosed systems is substantially reduced when compared to the more traditional Marangoni process implementations. The drying time in such processes is governed by the following equation: $t = d/v$ where:
$t$ = drying time;
$d$ = wafer diameter; and
$v$ = meniscus velocity.

As such, the drying time is directly proportional to the diameter of the wafer, which is the distance that the meniscus travels over the wafer surface. In the rinser/dryer of the present invention, the meniscus originates at the center of the wafer and, as such, experiences a travel distance that is effectively ½ of the total diameter of the wafer. This results in a drying time that is approximately ½ of the drying time experienced in a typical Marangoni processor in which the entire wafer is submersed in the rinsing fluid and gradually extracted therefrom.

The foregoing constructions also give rise to the ability to perform sequential processing of a single wafer using two or more rinsing/drying fluids sequentially provided through a single inlet of the reaction chamber. Still further, the ability to concurrently provide different fluids to the upper and lower surfaces of the wafer opens the opportunity to implement novel rinsing/drying processing operations.

The present invention has been illustrated with respect to a wafer. However, it will be recognized that the present invention has a wider range of applicability. By way of example, the present invention is applicable in the processing of disks and heads, flat panel displays, microelectronic masks, and other devices requiring effective and controlled wet processing.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A method for rinsing and drying a workpiece, comprising:
    placing the workpiece into a chamber;
    spinning the workpiece about a spin axis;
    applying a rinsing fluid onto the workpiece from a first opening through a first wall of the chamber, and with a first opening fixed in place and substantially aligned on the spin axis, with the rinsing fluid moving outwardly towards the edge of the workpiece via centrifugal force, to rinse the workpiece;
    applying a drying fluid onto the workpiece from the first opening, with the drying fluid moving outwardly towards the edge of the workpiece via centrifugal force, to dry the workpiece.

2. The method of claim 1 further comprising heating the rinsing fluid and/or the drying fluid.

3. The method of claim 1 wherein the workpiece has a first side and a second side, and with the rinsing fluid and the drying fluid applied to the second side through a second opening in a second wall of the chamber.

4. The method of claim 1 wherein the drying fluid follows a meniscus of the rinsing fluid across the workpiece surface.

5. The method of claim 1 further comprising controlling the temperature of the rinsing fluid, or the drying fluid, or both.

6. The method of claim 1 further comprising stopping the applying of the rinsing fluid before starting the applying of the drying fluid.

7. The method of claim 6 wherein the drying fluid has a leading edge following substantially immediately behind a trailing edge of the rinsing fluid.

8. The method of claim 1 further comprising regulating flow of the rinsing and drying fluids across the workpiece surface.

9. The method of claim 8 wherein the rinsing fluid, or the drying fluid, or both fluids, are applied to a central area of the workpiece.

10. A method for rinsing and drying a workpiece, comprising:
    placing the workpiece into a chamber;
    spinning the workpiece;
    applying a rinsing fluid onto the workpiece through a first outlet in the chamber, with the rinsing fluid moving outwardly towards the edge of the workpiece via centrifugal force, to rinse the workpiece;
    applying a drying fluid onto the workpiece through the first outlet, with the drying fluid moving outwardly towards the edge of the workpiece via centrifugal force, to dry the workpiece; and
    with the workpiece is in a substantially horizontal orientation and wherein the rinsing fluid and the drying fluid are applied generally simultaneously to the up facing and down facing surfaces of the workpiece.

11. A method for rinsing and drying a workpiece, comprising:
    placing the workpiece into a chamber;
    spinning the workpiece about a spin axis;
    applying rinsing fluid onto a first side of the workpiece from a first nozzle substantially aligned on the spin axis, with the rinsing fluid moving outwardly over the first side of workpiece towards the edge of the workpiece via centrifugal force, to rinse the first side of the workpiece;
    applying rinsing fluid onto a second side of the workpiece from a second nozzle substantially aligned on the spin axis, with the rinsing fluid moving outwardly over the second side of the workpiece towards the edge of the workpiece via centrifugal force, to rinse the second side of the workpiece;

applying drying fluid onto the first side of the workpiece from the first nozzle, with the drying fluid moving outwardly over the first side of the workpiece towards the edge of the workpiece via centrifugal force, to dry the first side of the workpiece; and applying drying fluid onto the second side of the workpiece from the second nozzle, with the drying fluid moving outwardly over the second side of the workpiece towards the edge of the workpiece via centrifugal force, to dry the second side of the workpiece.

12. A method for rinsing and drying a workpiece, comprising:

placing the workpiece into a chamber formed by an upper rotor engaged with a lower rotor;

spinning the workpiece about a spin axis;

applying rinsing fluid onto an upper surface of the workpiece through an upper opening in the upper rotor, with the rinsing fluid moving outwardly towards the edge of the workpiece via centrifugal force, to rinse the upper surface of the workpiece; and applying drying fluid onto the upper surface of the workpiece through the upper opening, with the drying fluid moving outwardly towards the edge of the workpiece via centrifugal force, to dry the upper surface of the workpiece.

13. The method of claim 12 further comprising:

applying rinsing fluid onto a lower surface of the workpiece through a lower opening in the lower rotor, with the rinsing fluid moving outwardly towards the edge of the workpiece via centrifugal force, to rinse the lower surface of the workpiece; and applying drying fluid onto the lower surface of the workpiece through the lower opening, with the drying fluid moving outwardly towards the edge of the workpiece via centrifugal force, to dry the lower surface of the workpiece.

14. The method of clam 13 wherein the upper and lower openings are substantially aligned on the spin axis.

15. The method of claim 12 further comprising removing rinsing fluid from the chamber through a plurality of drain openings adjacent to an outer diameter of the upper or lower rotor.

* * * * *